United States Patent
Felder et al.

(10) Patent No.: US 11,054,491 B2
(45) Date of Patent: Jul. 6, 2021

(54) DIPOLE ANTENNA ASSEMBLY FOR CAPTURING IMAGES BY MEANS OF NUCLEAR MAGNETIC RESONANCE METHODS

(71) Applicant: FORSCHUNGSZENTRUM JUELICH GMBH, Juelich (DE)

(72) Inventors: Joerg Felder, Juelich (DE); Suk Min Hong, Wuerselen (DE); Nadim Joni Shah, Juelich (DE); Arthur William Magill, Leimen (DE)

(73) Assignee: FORSCHUNGSZENTRUM JUELICH GMBH, Juelich (DE)

( * ) Notice: Subject to any disclaimer, the term of this patent is extended or adjusted under 35 U.S.C. 154(b) by 0 days.

(21) Appl. No.: 16/349,633

(22) PCT Filed: Nov. 24, 2017

(86) PCT No.: PCT/DE2017/000402
§ 371 (c)(1),
(2) Date: May 14, 2019

(87) PCT Pub. No.: WO2018/108193
PCT Pub. Date: Jun. 21, 2018

(65) Prior Publication Data
US 2020/0072919 A1    Mar. 5, 2020

(30) Foreign Application Priority Data
Dec. 15, 2016   (DE) .................... 10 2016 014 978.7

(51) Int. Cl.
*G01V 3/00* (2006.01)
*G01R 33/34* (2006.01)
(Continued)

(52) U.S. Cl.
CPC ..... *G01R 33/34038* (2013.01); *G01R 33/422* (2013.01); *G01R 33/4806* (2013.01)

(58) Field of Classification Search
CPC .............. G01R 33/5608; G01R 33/543; G01R 33/3815; G01R 33/3804; A61B 5/055
(Continued)

(56) References Cited

U.S. PATENT DOCUMENTS 5,602,479 A * 2/1997 Srinivasan ....... G01R 33/34046
324/318
2008/0169928 A1* 7/2008 Mickle ............... G06K 19/0723
340/572.4
(Continued)

FOREIGN PATENT DOCUMENTS

CN   102460196 A   5/2012
CN   204407506 U   6/2015
(Continued)

OTHER PUBLICATIONS

Peng Jin et al: Multi-Frequency, Linear and Circular Polarized, Metamaterial-Inspired, Near-Field Resonant Parasitic Antennas, IEEE Transactions on Antennas and Propagation, vol. 59, No. 5, Mar. 3, 2011 (Mar. 3, 2011), pp. 1446-1459, XP055456576.
(Continued)

*Primary Examiner* — Walter L Lindsay, Jr.
*Assistant Examiner* — Frederick Wenderoth
(74) *Attorney, Agent, or Firm* — Leydig, Voit & Mayer, Ltd.

(57) ABSTRACT

A dipole antenna assembly includes at least two dipole antennas mechanically, but not electrically, connected to each other. The at least two dipole antennas cross at an intersection point and form dipole antenna arms starting from the intersection point. The dipole antenna arms are arranged in a half-space.

20 Claims, 3 Drawing Sheets

(51) Int. Cl.
    *G01R 33/422* (2006.01)
    *G01R 33/48* (2006.01)
(58) Field of Classification Search
    USPC .................................................. 324/322
    See application file for complete search history.

(56) References Cited

U.S. PATENT DOCUMENTS

| | | | |
|---|---|---|---|
| 2009/0096553 | A1 | 4/2009 | Driesel et al. |
| 2010/0253353 | A1 | 10/2010 | Cork et al. |
| 2010/0280340 | A1 | 11/2010 | Homan et al. |
| 2011/0115486 | A1 | 5/2011 | Froehlich et al. |
| 2012/0088674 | A1 | 4/2012 | Faley et al. |
| 2014/0240188 | A1 | 8/2014 | Mamo et al. |

FOREIGN PATENT DOCUMENTS

| | | |
|---|---|---|
| CN | 105379016 A | 3/2016 |
| JP | 0951886 A | 2/1997 |
| WO | WO 2006015803 A1 | 2/2006 |
| WO | 2010044389 A | 4/2010 |

OTHER PUBLICATIONS

Wiggins G.C. et al: "Mixing loops and electric dipole antennas for increased sensitivity at 7 Tesla", Porceedings of the International Society for Magnetic Resonance in Medicine, 21$^{st}$ Annual Meeting & Exhibition, Apr. 7, 2013 (Apr. 7, 2013), pp. 2737, XP040630333.

Jinfeng Tian et al: "Design considerations for dipole for head MRI at 10.5T", 2015 IEEE MTT-S 2015 International Microwave Workshop Series on RF and Wireless Technologies for Biomedical and Healthcare Applications (IMWS-BIO), Sep. 21, 2015 (Sep. 21, 2015), pp. 99-100, XP055456335.

G. Shajan et al: "Three-layered radio frequency coil arrangement for sodium MRI of the human brain at 9.4 Tesla: RF Coil for 23 Na MRI at 9.4T", Magnetic Resonance in Medicine, vol. 75, No. 2, Mar. 11, 2015 (Mar. 11, 2015), pp. 906-916, XP055456391.

W. Koning et al: "High-resolution Mri of the carotid arteries using a leaky waveguide transmitter and a high-density receive array at 7 T", Magnetic Resonance in Medicine, vol. 69, No. 4, Jul. 3, 2012 (Jul. 3, 2012), pp. 11861193, XP055456343.

Hong S.-M. et al: "A bent dipole antenna and 4-channel loop array for 1H/31P brain application at 3 T MRI", International Society for Magnetic Resonance in Medicine, No. 4320, Apr. 7, 2017 (Apr. 7, 2017), XP040691888.

M. Arcan Ertürk et al: "A 16-channel combined loop-dipole transceiver array for 7 Tesla body MRI", Magnetic Resonance in Medicine, vol. 77, No. 2, Feb. 17, 2016 (Feb. 17, 2016), pp. 884-894, XP055456339.

Celal Oezerdem et al: "16-channel bow tie antenna transceiver array for cardiac MR at 7.0 tesla", Magnetic Resonance in Medicine, vol. 75, No. 6, Jul. 17, 2015 (Jul. 17, 2015), pp. 2553-2565, XP055456348.

Xinqiang Yan, et al., "A monopole/loop dual-tuned RF coil for ultrahigh field MRI", Quant Imaging Med Surg, vol. 4, No. 4, Dec. 2014, pp. 225-231.

Xinqiang Yan, et al., "Hybrid monopole/loop coil array for human head MR imaging at 7T", Appl Magn Reson, vol. 46, No. 5, May 1, 2015, pp. 1-13.

Gary X. Shen, et al., "Experimentally Verified, Theoretical Design of Dual-Tuned, Low-Pass Birdcage Radiofrequency Resonators for Magnetic Resonance Imaging and Magnetic Resonance Spectroscopy of Human Brain at 3.0 Tesla", Magnetic Resonance in Medicine, vol. 41, Dec. 1999, pp. 268-275.

W.M. Potter, et al., "Evaluation of a New $^1H/^{31}P$ Dual-Tuned Birdcage Coil for $^{31}P$ Spectroscopy", Concepts in Magnetic Resonance Part B: Magnetic Resonance Engineering, vol. 43, No. 3, Aug. 1, 2013, pp. 90-99.

Martin Meyerspeer, et al., "An Improved Trap Design for Decoupling Multinuclear RF Coils", Magnetic Resonance in Medicine, vol. 72, Dec. 2014, pp. 584-590.

Seunghoon Ha, et al., "A PIN diode controlled dual-tuned Mri Rf coil and phased array for multi nuclear imaging", Physics in Medicine and Biology, vol. 55, Dec. 2010, pp. 2589-2600.

Paul A-Bottomley, et al., Paul A. Bottomley, et al., "Proton-Decoupled. Overhauser-Enhanced, Spatially Localized Carbon-13 Spectroscopy in Humans", Magnetic Resonance in Medicine, vol. 12, Dec. 1989, pp. 348-363.

Gregor Adriany, et al., "A Half-Volume Coil for Efficient Proton Decoupling in Humans at 4 Tesla", Journal of Magnetic Resonance, vol. 125, Dec. 1997, pp. 178-184.

Arash Dabirzadeh, et al., "Trap Design for Insertable Second-Nuclei Radiofrequency Coils for Magnetic Resonance Imaging and Spectroscopy", Concepts in Magnetic Resonance Part B Magnetic Resonance Engineering, vol. 35, No. 3, Aug. 2009, pp. 121-132.

Qi Duan, et al., "The Multi-Pole Antenna Array", ISMRM 24$^{th}$ Annual Meeting & Exhibition, May 10, 2016, pp. 2-8, The International Society for Magnetic Resonance, Singapore.

Karthrik Lakshmanan, et al., "The Circular Dipole", Proceedings of the Joint Meeting ISMRM-ESMRMB, Dec., 2014, p. 0315, vol. 315, Milan, Italy.

* cited by examiner

DIPOLE ANTENNA ASSEMBLY FOR CAPTURING IMAGES BY MEANS OF NUCLEAR MAGNETIC RESONANCE METHODS

CROSS REFERENCE TO RELATED APPLICATIONS

This application is a U.S. National Stage Application under 35 U.S.C. § 371 of International Application No. PCT/DE2017/000402 filed on Nov. 24, 2017, and claims benefit to German Patent Application No. DE 10 2016 014 978.7 filed on Dec. 15, 2016. The International Application was published in German on Jun. 21, 2018 as WO 2018/108193 A1 under PCT Article 21(2).

FIELD

The invention relates to a dipole antenna assembly for capturing images by means of nuclear magnetic resonance methods.

BACKGROUND

With magnetic resonance imaging (MRI), resonance images of protons are usually measured. In order to obtain additional information, images that are generated with imaging methods under the stimulation of X nuclei are also captured. X nuclei are NMR-active nuclei that are different from hydrogen nuclei. Such nuclei are known to the person skilled in the art. For example, 23Na nuclei or 31P nuclei are used. The recordings with the X nuclei are usually made temporally separate from the recordings with the H nuclei. Measurements of X nuclei usually generate complementary information for measurements on hydrogen nuclei. Examples of additional information that can be provided by X-nucleus measurements are metabolic information or statements regarding cell viability. However, X-nucleus signals in MRI are significantly lower than proton signals. Therefore, 1H measurements are often performed to improve X-nucleus measurements. Examples of combined measurements using the proton channel are scout images and $B_0$ shimming. In medicine, MRI is currently typically operated with devices that use a field strength of between 0.25 T and 4 T. Devices with a field strength of 7 T are under development for clinical use. In principle, however, all magnetic field strengths can be used, but may require a special permit for operation.

For performing combined X/1H measurements, different methods for the construction of dual-tuned or triple-tuned MRI coil assemblies are known. One problem is the decoupling of the protons and X-nucleus resonances of the coils. Various methods and devices are already known for this purpose.

A decoupling of the coils by means of blocking circuits (for example, dual-tuned birdcage resonators with passive blocking circuits, mostly on alternating posts) is described in the publications of Shen G X, Wu J f, Boada F E, Thulborn K R. Experimentally verified, theoretical design of dual-tuned, low-pass birdcage radiofrequency resonators for magnetic resonance imaging and magnetic resonance spectroscopy of human brain at 3.0 Tesla. Magn. Reson. Med. 1999; 41:268-275. doi: 10.1002/(SICI)1522-2594(199902)41:2<268::AID-MRM9>3.0.CO;2-G, Meyerspeer M, Roig E S, Gruetter R, Magill A W. An improved trap design for decoupling multinuclear RF coils. Magn. Reson. Med. 2013: n/a-n/a. doi: 10.1002/mrm.24931 and Dabirzadeh A, McDougall M P. Trap design for insertable second-nuclei radiofrequency coils for magnetic resonance imaging and spectroscopy. Concepts Magn. Reson. Part B Magn. Reson. Eng. 2009; 35B:121-132. doi: 10.1002/cmr.b.20139.

A decoupling using PIN diodes (for example, two independent RF coils that are alternately detuned) is disclosed in the publication, Ha S, Hamamura M J, Nalcioglu O, Muftuler L T. A PIN diode controlled dual-tuned MRI RF coil and phased array for multi nuclear imaging. Phys. Med. Biol. 2010; 55:2589-2600. doi: 10.1088/0031-9155/55/9/011.

A geometric decoupling, e.g., a "butterfly coil" and centered surface coils, is described in the publications, Bottomley P A, Hardy C J, Roemer P B, Mueller O M. Proton-decoupled, overhauser-enhanced, spatially localized carbon-13 spectroscopy in humans. Magn. Reson. Med. 1989; 12:348-363. doi: 10.1002/mrm. 1910120307, Adriany G, Gruetter R. A half-volume coil for efficient proton decoupling in humans at 4 Tesla. J. Magn. Reson. San Diego Calif. 1997 1997; 125:178-184. doi: 10.1006/jmre. 1997.1113.

A further approach is provided by modified resonator structures (for example, birdcage resonators with additional end rings), as they are described in Potter W m., Wang L, McCully K k., Zhao Q. Evaluation of a new 1H/31P dual-tuned birdcage coil for 31P spectroscopy. Concepts Magn. Reson. Part B Magn. Reson. Eng. 2013; 43:90-99. doi: 10.1002/cmr.b.21239.

Dipole and monopole antennas can be used in dual-tuned systems in combination with surface coils. If they are arranged in the middle of the surface coil, a disappearing, coupled magnetic flux arises due to the magnetic fields of both conductor arrangements (Shajan G, Mirkes C, Buckenmaier K, Hoffmann J, Pohmann R, Scheffler K. Three-layered radio frequency coil arrangement for sodium MRI of the human brain at 9.4 Tesla. Magn. Reson. Med. 2015:n/a-n/a. doi: 10.1002/mrm.25666, Yan X, Wei L, Xue R, Zhang X. Hybrid Monopole/Loop Coil Array for Human Head MR Imaging at 7 T. Appl. Magn. Reson. 2015:1-10. doi: 10.1007/s00723-015-0656-5. Yan X, Xue R, Zhang X. A monopole/loop dual-tuned RF coil for ultrahigh field MRI. Quant. Imaging Med. Surg. 2014; 4:225-231). Accordingly, such decoupling mechanism between monopole/dipole and surface coils is also based upon a geometric decoupling.

SUMMARY

In an embodiment, the present invention provides a dipole antenna assembly. The dipole antenna assembly includes at least two dipole antennas mechanically, but not electrically, connected to each other. The at least two dipole antennas cross at an intersection point and form dipole antenna arms starting from the intersection point. The dipole antenna arms are arranged in a half-space.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
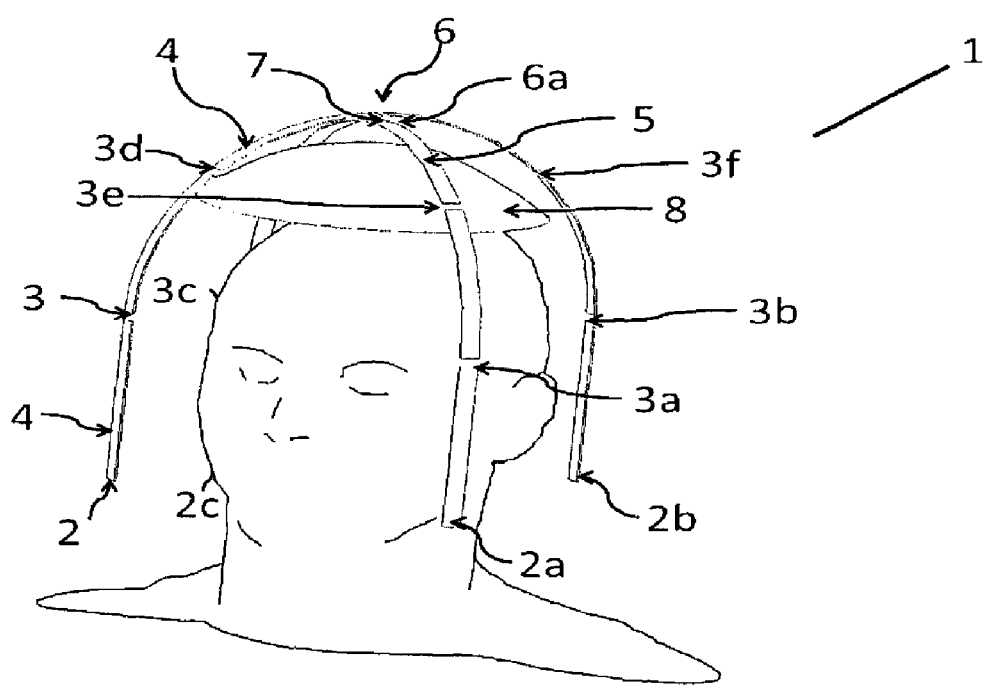
FIG. 1 illustrates a dipole antenna assembly according to an embodiment of the invention.

All methods, except for geometric decoupling, require the introduction of additional components into the resonant circuits of otherwise monofrequency coils, which is associated with additional losses. They lead to a reduction in the quality of the HF coil, and thus to a reduction in the SNR in the captured MR signal. At the same time, production costs increase due to higher component costs and complex tuning of the blocking circuits or tuning units.

Therefore, embodiments of the invention provide methods and devices that enable decoupling of 1H/X-nucleus resonances in a simple and cost-effective manner, without thereby affecting the quality of the RF coil. The methods and devices are to be applicable, in particular, in the clinically relevant field of application below 4 Tesla.

With methods and devices according to embodiments of invention, it is possible to decouple coil resonances of 1H and X-nucleus frequencies even at clinically-relevant field strengths using dipole antennas and surface coils. Thereby, the quality of the HF coils used is not reduced.

According to an embodiment of the invention, a dipole antenna assembly is provided; this can be arranged around a body part of a patient—especially, around his or her head—to excite or capture MR signals of different nuclei.

According to an embodiment of the invention, an assembly of at least two dipole antennas is provided; this can be arranged around a body part of a patient, e.g., his or her head, to excite or capture MR signals. For this purpose, at least two dipole antennas are connected mechanically, but not electrically, to one another so that they intersect at one point and enclose angles to each other. Preferably, equal angles are enclosed. Thus, 2, 3, 4 or more, e.g., 16 dipole antennas, can be arranged in this manner. With more than two dipole antennas in one assembly, an improvement in the circular polarization of the generated magnetic field can be achieved. More than two dipole antennas in one dipole antenna array can also be used in parallel-imaging techniques (such as fast imaging with sub-sampling of k-space) or parallel excitation.

The number of dipole antennas is limited to upper values only because of practical aspects. If, for example, the head of a patient is to be measured, an assembly that does not restrict the patient's field of vision is desirable. For example, two dipole antennas can be arranged at an angle of 90°, or three antennas can be arranged at an angle of 60° each. The parts of the dipole antennas emanating from the intersection point are referred to as "dipole antenna arms." The dipole antenna arms can enclose the same or different angles.

According to an embodiment of the invention, a dipole antenna has at least one curvature, which leads to the fact that the dipole antenna arms are arranged in a half-space and form, for example, a half circle, a section of an oval or another round geometry, but also a point. Likewise, a dipole antenna may have at least two curvatures representing a polygon bent in one direction; for example, the dipole antenna may have two bends of 90° or 95°, or three bends of 60° or 65°. In the case of at least two bends, they need not be of the same size; rather, equal angles are preferred for reasons of symmetry.

For numerous embodiments, the dipole antennas attached to the intersection point are to be arranged such that the dipole antenna arms form a screen that can accommodate a part of a patient's body, such as his or her head in a cage that is open on one side.

The dipole antennas of an assembly intersect geometrically—preferably in their middle.

Preferably, all dipole antenna arms are of the same length, such that the intersection point of the dipole antennas is in the middle of a dipole antenna, but single arms can also be longer or shorter compared to the other arms.

In an embodiment, the dipole antenna arms, in the half-space in which they are located, form longitudinal lines of a cylinder, wherein the term, "cylinder," is mathematically understood to mean that they are parallel to each other and are positioned on a circular layout or another round layout.

In another embodiment, the dipole antenna arms can also simulate the longitudinal lines of a cone. For example, the cone or truncated cone encloses an angle between 45° and 120°. The selection of the angle is based upon practical criteria. A body part of a patient, e.g., his or her head, is to be able to be captured by it, and the dipole antenna according to the invention is to be dimensioned such that it still fits into the MR device.

In an additional embodiment, the dipole antennas can form a bell shape.

The arms of the dipole antennas or the dipole antenna arms contain capacitances or inductances, such that a resonance frequency for the radiation to be received is established.

Thus, the dipole antenna can be set to the resonance frequency of the $^1$H nucleus or another nucleus. The introduction of capacitances or inductances of the resonance frequency is known to the person skilled in the art and can be carried out as a matter of routine.

In a preferred embodiment, the dipole antenna has a shielding cap, which is attached to the intersection point of the dipole antennas and/or to the dipole arms, for example. The shielding cap is advantageously attached to the feed point, since this is where the highest conservative electric fields occur. The shielding cap may be located within the bend of the dipole antennas.

The feed point is the point of a dipole antenna that is connected to a generator via an electrical line. Each dipole antenna requires a feed point, which can be at any point on the dipole antenna. An active or passive matching circuit can be connected between the feed point and the generator.

The shielding cap is preferably without openings and is continuously closed. This has the advantage that the electric field concentrated at the feeding point of the dipole antenna elements is shielded from the object under investigation. This in turn leads to a reduction in the warming/SAR of the object under investigation. The shielding cap leads to the reduction in SAR from conservative electric fields, which often lead to a limitation of the average excitation power in MR coils. This limits the field of application with regard to the applicable MRI sequences, and often leads to longer measurement times.

In an alternative embodiment, the shielding cap may also have openings or recesses to suppress eddy current effects in the MRI.

The shielding cap is preferably fixed to the feed point of the dipole antennas in a central-symmetrical manner, such that, starting from the feed point of the dipole antennas, a shielding of the electric fields takes place in a preferably uniform radius.

The shielding cap can have the geometry of a spherical cut, an oval, a polygon preferably bent into a curve, or another geometry.

The shielding cap has the advantage that conservative electric fields are shielded and electric eddy fields are weakened.

In an additional preferred embodiment, the dipole antenna according to the invention is combined with surface coils that are tuned to the resonance frequency of an X-nucleus.

For this purpose, surface coils are preferably attached to the dipole antenna arms in such a manner that the cross-sectional area of the surface coil is divided by the projection of a dipole antenna arm onto the cross-sectional area along an axis of symmetry. This decouples the respective dipole antennas and surface coils.

One or more surface coils can be arranged along the length of a dipole antenna arm. Multiple surface coils increase the number of channels for X-nucleus measurements, which can be used, for example, to improve SNR reception.

Preferably, all dipole antenna arms have at least one coil. This has the advantage that there are no gaps between the X-nucleus surface coils along the circumference. Such gaps lead to areas with low local sensitivity, i.e., poor SNR in this area.

The surface coils have capacitors with which the resonance frequency can be set. The person skilled in the art is familiar with setting the resonance frequency.

In one embodiment, all surface coils are set to the same resonance frequency, which corresponds to a specific X-nucleus to be measured.

In another embodiment, the capacitors of different surface coils can be arranged differently, such that they have different resonance frequencies. With this embodiment, signals from different X nuclei can be measured simultaneously. In this case, however, an additional decoupling of the X-nucleus elements from each other is usually necessary—for example, by introducing blocking circuits or PIN diodes.

The tables show physical data for antennas.

TABLE 1

|  | Birdcage coil | Curved dipole antenna with cap | Curved dipole antenna |
|---|---|---|---|
| Average $B_1^+$ whole head (µT) | 0.665 | 0.634 | 0.657 |
| Maximum 10 g SAR (W/kg) | 1.14 | 1.62 | 1.95 |

An average B1+ field with the same input power and maximum local (10 g) SAR normalizes to 1 W accepted power per assembly for a birdcage coil according to the prior art and the dipole antennas according to the invention, with and without a shielding cap.

TABLE 2

|  | 64 MHz | | 160 MHz | |
|---|---|---|---|---|
|  | Average | Maximum | Average | Maximum |
| Isolation between dipoles and surface coils (dB) | 38 | 27 | 49 | 38 |

Decoupling between dipole antennas and surface coils minimum

FIG. 1 shows a dipole antenna assembly 1 with four dipole antenna arms 2, 2a, 2b, 2c, in which the dipole antenna arms 2, 2a, 2b, 2c each have capacitances/inductances 3, 3a, 3b, 3c, . . . , 3e. The dipole antenna arms are areas of dipole antennas 4, 5 that are electrically insulated from each other at their feed point 6 by means for connecting the dipole antennas 7. There is a shielding cap 8 in the bend.

Figure 2:
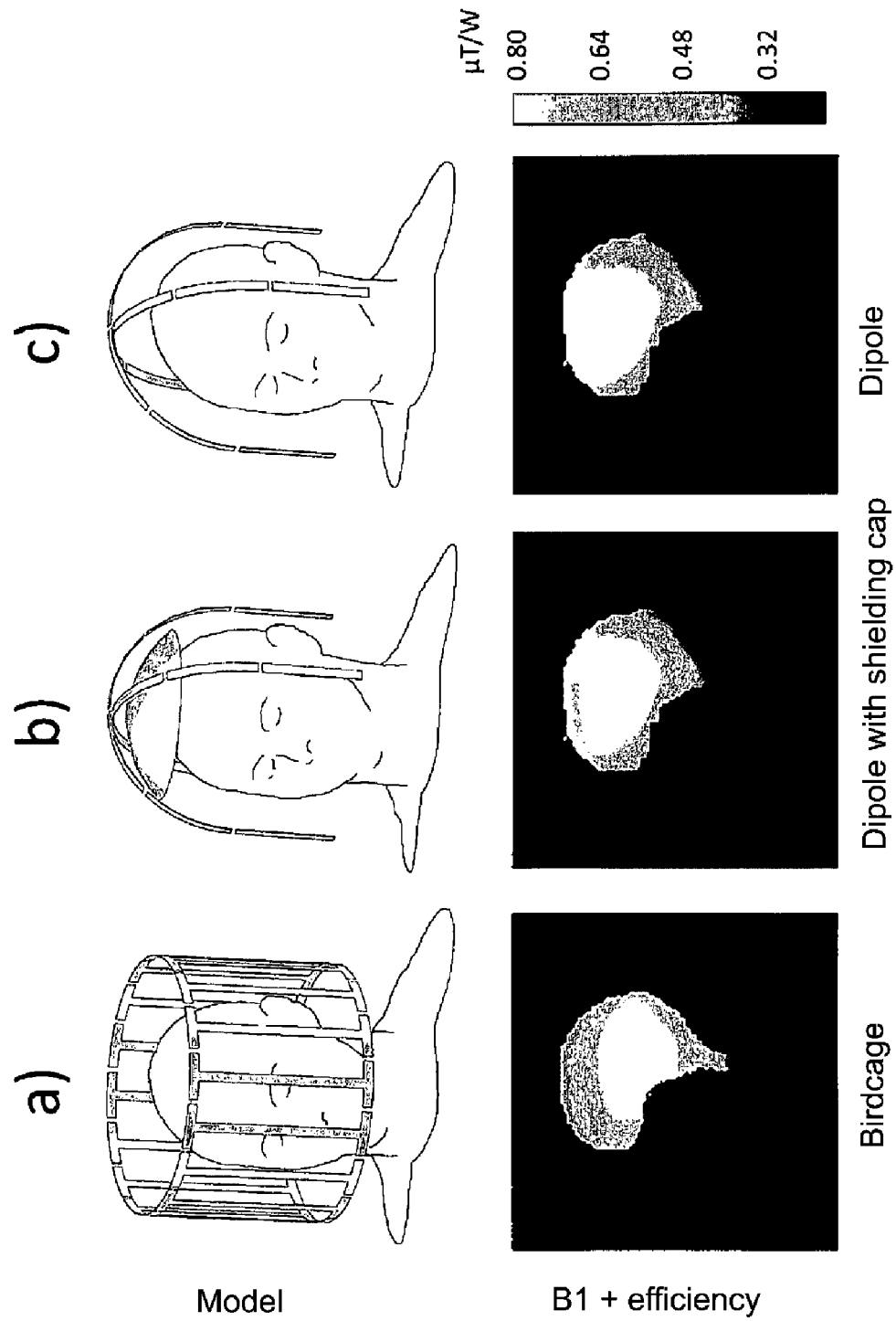
FIGS. 2 a), b) and c) illustrate dipole antenna assemblies without surface coils, with their efficiencies compared to the prior art.

FIG. 2 shows in column a) a birdcage coil with an illustration of the corresponding B1 efficiency. Column b) shows a dipole antenna assembly according to the invention with a shielding cap and its B1 efficiency in comparison. Column c) shows the same illustrations for a dipole antenna assembly without a shielding cap.

Figure 3:
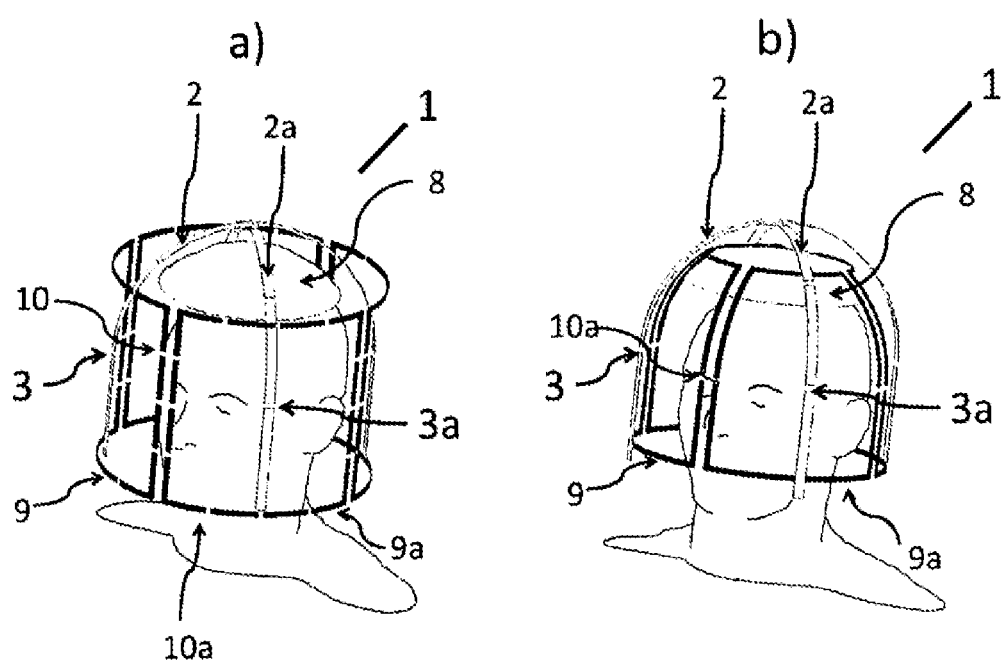
FIGS. 3 a) and b) illustrate a dipole antenna assembly according to an embodiment of the invention with a shielding cap and coils in two different geometric arrangements.

In FIG. 3, identical device characteristics have the same reference signs. Side a) shows a dipole antenna assembly 1 with a shielding cap 8. The dipole antenna arms 2, 2a, . . . have capacitances 3, 3a. Surface coils 9, 9a, . . . are arranged at the dipole antenna assembly 1 in such a manner that they are divided centrally by the dipole antenna arms 2, 2a. The coils also have capacitances 10, 10a, . . . .

Side b) shows the same assembly with the same reference signs as side a), but the coils 9, 9a, . . . are modeled after the curvature of the dipole antenna arms 2, 2a.

Example

In the following, the invention will be explained using an example, without this being interpreted restrictively.

A geometrically decoupled assembly is proposed (FIG. 1). Due to the curved configuration, the dipole antennas exhibit a geometric fundamental oscillation at 200 MHz. The natural frequency can be tuned to a clinical field strength by means of concentrated coils that are inserted into the dipole structure. In addition, a configuration with two vertical dipole antennas enables quadrature operation. The insulation between the two dipole antennas in the design shown here amounts to 34 dB. FIG. 2 shows a simulation model of birdcage coils, along with the curved, two-channel dipole antennas and their $B_1^+$ field distribution. Table 1 describes the average $B_1^+$ field in the entire brain when stimulated with identical input power, as well as the corresponding local (10 g) SAR values. The curved dipole antennas provide a similar average $B_1^+$ field strength throughout the brain, with the maximum $B_1^+$ focused more towards the upper part of the brain.

An optimized embodiment combines the dipole antenna with surface coils, which are tuned to an X-nucleus resonance. The configuration is shown in FIG. 3. Table 2 shows the insulation between dipole antennas and surface coils. The maximum coupling amounts to −27 dB. The geometric decoupling of the two assemblies is easy to implement and does not require a sophisticated blocking circuit. 1H and X systems can both be operated simultaneously in quadrature. There is no deterioration in the intrinsic SNR of the individual systems, since no further (lossy) components have to be inserted into the circuit for decoupling. In addition, the assembly can also be used for decoupling experiments.

An additional preferred embodiment uses a shielding cap below the feeding point of the dipole antennas in order to shield the conservative electric fields generated at this point. Table 1 illustrates the shielding effect using the local SAR values. Curved dipole antennas produce 1.95 W/kg maximum local SAR. The shielding cap reduces this value to 1.65 W/kg. The shielding of electric fields with conductive materials is well known in MRI coil construction. In this preferred embodiment, the shielding serves the dual purpose of reducing the local SAR and homogenizing the $B_1^+$ field distribution by suppressing the strong $B_1^+$ peak below the dipole feed points. Eddy currents on the shield can be suppressed by slitting the shield and using capacitance to close the high-frequency current path.

A feature of the invention is a curved dipole antenna, which enables the use of dipole structures at clinical field strengths. Conventional straight dipoles below 4 T cannot be used due to their length. At the same time, the bend of the dipole antennas in the proposed manner does not destroy the symmetrical field distribution of the dipole itself, such that geometric decoupling with additional MRI coils remains possible. The preferred embodiment is to use at least two dipole antennas, in order to achieve quadrature operation. It should be noted that, in a straight dipole assembly, at least four elements on a cylindrical circular line are required in order to achieve a circular polarization within the cylinder (8). The higher SAR at the feed points of the dipole antennas compared to a standard birdcage coil can be reduced by using a conductive shielding cap that can be easily integrated into the coil. This shielding cap does not obstruct the access to the eyes and ears of a patient, in case this becomes necessary, for example, during a functional MRI measurement.

Adding surface structures—one for both ends of the curved dipoles—results in a geometrically-decoupled configuration that is ideal for MRI using different nuclei. In this arrangement, which facilitates manufacturing and optimizes SNR, there is no need for blocking circuits. The proposed configuration with four surface coils offers sufficient space for the use of functional MRI devices (headphones, glasses, etc.). It is also ideally suited for combined PET-MR measurements, since highly-absorbing metal structures for gamma radiation occur only in a few room areas, and the control of the 1H and X coil systems can take place outside the field-of-view of the PET device.

A dual-tuned 4 T 1H/31P coil system was built. The two curved dipoles of 60 cm length, which are operated in quadrature, are tuned to 160 MHz. The dipole antennas are tuned by means of coils at the feed point. The quadrature insulation between the two dipoles amounts to 34 dB. The conservative electric fields at the dipole feed points are shielded with a uniform metal disc (shielding cap). $B_1^+$ efficiency of a proton birdcage coil and the shielded dipole antenna structure are of the same order of magnitude. With the curved dipole antenna, the local SAR is slightly higher compared to a birdcage coil, but such values still enable safe use within the legal SAR limits.

The dipole antenna structure was combined with four surface coils (FIG. 3), which are tuned to the 31 P frequency at 4 T (64 MHz). The surface coils are inductively decoupled from each other. The average decoupling between the proton and 31 P channel is 49 dB at 160 MHz, and −8 dB at 64 MHz (Table 2). The SNR of the 31 P surface coils is identical to that of a similarly-sized assembly without the dipole antennas.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A dipole antenna assembly, comprising:
at least two dipole antennas electrically insulated from each other by electrical insulation that mechanically connects the at least two dipole antennas to each other,
wherein each respective dipole antenna of the at least two dipole antennas includes dipole antenna arms starting from a geometric intersection point at which the at least two dipole antennas cross geometrically, and
wherein the dipole antenna arms are arranged in a half-space.

2. The dipole antenna assembly according to claim 1, wherein the at least two dipole antennas include 3 to 16 dipole antennas.

3. The dipole antenna assembly according to claim 1, wherein a curvature of the at least two dipole antennas describes a semicircle or section of an oval.

4. The dipole antenna assembly according to claim 1, wherein the geometric intersection point is located at a igeometric center of each of the at least two dipole antennas.

5. The dipole antenna assembly according to claim 1, wherein the dipole antenna arms, in the half-space in which they are located, form longitudinal lines of a cylinder or a cone.

6. The dipole antenna assembly according to claim 1, wherein the dipole antenna arms contain capacitances or inductances.

7. The dipole antenna assembly according to claim 1, further comprising a shielding cap.

8. The dipole antenna assembly according to claim 7, wherein the shielding cap is attached to the intersection point.

9. The dipole antenna assembly according to claim 7, wherein the shielding cap is attached to a feed point of the dipole antenna assembly, wherein the feed point of the dipole antenna assembly is connected to a generator.

10. The dipole antenna assembly according to claim 1, wherein a surface coil is arranged on at least one dipole antenna arm.

11. The dipole antenna assembly according to claim 10, wherein a cross-sectional area of the surface coil is divided by the projection of a dipole antenna arm onto the cross-sectional area along an axis of symmetry.

12. The dipole antenna assembly according to claim 1, further comprising, for each respective dipole antenna of the at least two dipole antennas, a respective electrical line connected, at a respective feed point, to the respective dipole antenna, wherein each respective electrical line is connected to a generator.

13. The dipole antenna assembly according to claim 1, wherein an active or passive matching circuit is connected between each respective feed point and the generator.

14. The dipole antenna assembly according to claim 1, further comprising one or more surface coils, wherein the one or more surface coils are inductively decoupled from each other.

15. The dipole antenna assembly according to claim 14, further comprising a shielding cap attached to a feed point of the dipole antenna assembly.

16. The dipole antenna assembly according to claim 15, further comprising, for each respective dipole antenna of that at least two dipole antennas, a respective electrical line connected, at the feed point, to the respective dipole antenna, wherein each respective electrical line is connected to a generator.

17. The dipole antenna assembly according to claim 14, wherein the at least two dipole antennas and the one or more surface coils are decoupled from one another.

18. The dipole antenna assembly according to claim 17, wherein each respective dipole antenna of the at least two dipole antennas has a capacitance and/or an inductance that establishes a resonance frequency of the respective dipole antenna, and wherein each respective surface coil of the one or more surface coils has a capacitance and/or an inductance that establishes a resonance frequency of the respective surface coil.

19. The dipole antenna assembly according to claim 18, wherein at least one respective dipole antenna has a resonance frequency set to a resonance frequency of the $^1$H nucleus, and wherein at least one respective surface coil has a resonance frequency set to a resonance frequency of an X-nucleus.

20. The dipole antenna assembly according to claim 18, wherein the one or more surface coils include at least two surface coils that each have a different resonance frequency.

* * * * *